(12) United States Patent
Kataigi et al.

(10) Patent No.: US 8,540,819 B2
(45) Date of Patent: Sep. 24, 2013

(54) CERAMIC HEATER

(75) Inventors: Takashi Kataigi, Handa (JP); Yuji Akatsuka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 1003 days.

(21) Appl. No.: 12/407,214

(22) Filed: Mar. 19, 2009

(65) Prior Publication Data
US 2009/0235866 A1    Sep. 24, 2009

(30) Foreign Application Priority Data

Mar. 21, 2008 (JP) ................................. 2008-074478
Mar. 19, 2009 (JP) ................................. 2009-068611

(51) Int. Cl.
*C23C 16/50* (2006.01)
*C23C 16/00* (2006.01)
*C23F 1/00* (2006.01)
*H01L 21/306* (2006.01)

(52) U.S. Cl.
USPC ...... 118/728; 118/715; 118/722; 156/345.51; 156/345.52; 156/345.53

(58) Field of Classification Search
USPC ........ 118/715, 728–732; 156/345.51–345.55
See application file for complete search history.

(56) References Cited

U.S. PATENT DOCUMENTS

| | | | | |
|---|---|---|---|---|
| 4,551,192 A | * | 11/1985 | Di Milia et al. | 156/345.51 |
| 5,730,803 A | * | 3/1998 | Steger et al. | 118/723 R |
| 6,464,795 B1 | * | 10/2002 | Sherstinsky et al. | 118/728 |
| 6,648,976 B1 | * | 11/2003 | Matsuda et al. | 118/728 |
| 6,730,175 B2 | * | 5/2004 | Yudovsky et al. | 118/728 |
| 2003/0118732 A1 | * | 6/2003 | Stevens et al. | 427/346 |
| 2006/0222481 A1 | * | 10/2006 | Foree | 414/800 |

FOREIGN PATENT DOCUMENTS

| | | |
|---|---|---|
| JP | 2002-047071 A1 | 2/2002 |
| JP | 2003-142564 A1 | 5/2003 |

* cited by examiner

*Primary Examiner* — Parviz Hassanzadeh
*Assistant Examiner* — Tiffany Nuckols
(74) *Attorney, Agent, or Firm* — Burr & Brown

(57) ABSTRACT

A ceramic heater for a semiconductor substrate process includes a plate and a shaft. The plate includes a first base and a second base bonded to the first base. Defined on a mounting surface of the first base are: a first region having a surface contacting with a mounted substrate; a purge groove provided in the portion covered with the substrate and surrounds the first region; and a second region having a surface surrounding the purge groove. The first base has: an adsorber configured to adsorb the mounted substrate onto the surface of the first region; and multiple purge holes each penetrating from the bottom surface of the purge groove to the lower surface of the first base. The purge groove is supplied with a purge gas through the multiple purge holes. The surface of the second region is located lower than that of the first region.

10 Claims, 11 Drawing Sheets

FIG. 11

| | PURGE GROOVE | | | PURGE HOLE | | | HEAT UNIFORMITY | | FILM-FORMATION PROPERTY | | CORROSION AMOUNT |
|---|---|---|---|---|---|---|---|---|---|---|---|
| | WIDTH | DEPTH | SURFACE-TO-SURFACE DISTANCE | DIAMETER | PCD | NUMBER | ENTIRE | OUTER PERIPHERY | TEMPORAL CHANGE | PARTICLE | |
| COMPARATIVE EXAMPLE | A | A | A | A | A | A | ◎ | ○ | × | × | × |
| TEST EXAMPLE 1 | D | D | D | D | D | D | ◎ | ◎ | ◎ | ◎ | ◎ |
| TEST EXAMPLE 2 | B | D | D | D | D | D | × | × | × | ○ | × |
| TEST EXAMPLE 3 | C | D | D | D | D | D | ○ | ○ | ◎ | ○ | ○ |
| TEST EXAMPLE 4 | E | D | D | D | D | D | ○ | ○ | ◎ | ◎ | ◎ |
| TEST EXAMPLE 5 | F | D | D | D | D | D | ○ | × | × | × | × |
| TEST EXAMPLE 6 | D | B | D | D | D | D | × | × | ◎ | ○ | ○ |
| TEST EXAMPLE 7 | D | C | D | D | D | D | ○ | ○ | ◎ | ◎ | ◎ |
| TEST EXAMPLE 8 | D | E | D | D | D | D | ○ | ○ | ◎ | ◎ | ◎ |
| TEST EXAMPLE 9 | D | F | D | D | D | D | ○ | × | ◎ | ○ | × |
| TEST EXAMPLE 10 | D | D | A | D | D | D | × | × | × | × | × |
| TEST EXAMPLE 11 | D | D | B | D | D | D | ○ | × | × | ○ | × |
| TEST EXAMPLE 12 | D | D | C | D | D | D | ◎ | ○ | ◎ | ◎ | ◎ |
| TEST EXAMPLE 13 | D | D | E | D | D | D | ◎ | ○ | ◎ | ◎ | ◎ |
| TEST EXAMPLE 14 | D | D | F | D | D | D | × | × | ◎ | ○ | × |
| TEST EXAMPLE 15 | D | D | D | B | D | D | ◎ | ◎ | × | × | ○ |
| TEST EXAMPLE 16 | D | D | D | C | D | D | ◎ | ◎ | ◎ | ◎ | ◎ |
| TEST EXAMPLE 17 | D | D | D | E | D | D | ◎ | ○ | ◎ | ◎ | ◎ |
| TEST EXAMPLE 18 | D | D | D | F | D | D | ○ | × | ◎ | ○ | × |
| TEST EXAMPLE 19 | D | D | D | D | B | D | ○ | × | ◎ | ○ | × |
| TEST EXAMPLE 20 | D | D | D | D | C | D | ○ | ○ | ◎ | ◎ | ◎ |
| TEST EXAMPLE 21 | D | D | D | D | E | D | ◎ | ◎ | ◎ | ◎ | ◎ |
| TEST EXAMPLE 22 | D | D | D | D | F | D | ◎ | ◎ | × | × | ○ |
| TEST EXAMPLE 23 | D | D | D | D | D | B | ○ | × | × | ○ | × |
| TEST EXAMPLE 24 | D | D | D | D | D | C | ○ | ○ | ◎ | ◎ | ◎ |
| TEST EXAMPLE 25 | D | D | D | D | D | E | ○ | ○ | ◎ | ◎ | ◎ |
| TEST EXAMPLE 26 | D | D | D | D | D | F | × | × | ◎ | ○ | × |

FIG. 12

| | A | B | C | D | E | F |
|---|---|---|---|---|---|---|
| PURGE GROOVE : WIDTH (mm) | 0 | <0.5 | 0.5 | 2 | 4 | >4 |
| PURGE GROOVE : DEPTH (mm) | 0 | <0.025 | 0.025 | 0.08 | 0.25 | >0.25 |
| PURGE GROOVE : SURFACE-TO-SURFACE DISTANCE (mm) | 0 | <0.01 | 0.01 | 0.05 | 0.1 | >0.1 |
| PURGE HOLE : DIAMETER (mm) | 0 | <0.25 | 0.25 | 1 | 2 | >2 |
| PURGE HOLE : PCD (mm) | 0 | <280 | 280 | 290 | 299 | >299 |
| PURGE HOLE : NUMBER | 0 | <8 | 8 | 36 | 48 | >48 |

FIG. 13

| EVALUATION CRITERIA | ◎ | ○ | × |
|---|---|---|---|
| HEAT UNIFORMITY : ENTIRE | LOWER THAN 3°C | 3°C OR HIGHER BUT LOWER THAN 5°C | 5°C OR HIGHER |
| HEAT UNIFORMITY : OUTER PERIPHERY | LOWER THAN 2°C | 2°C OR HIGHER BUT LOWER THAN 3°C | 3°C OR HIGHER |
| FILM-FORMATION PROPERTY : TEMPORAL CHANGE | LESS THAN 1% | 1% OR MORE BUT LESS THAN 2% | 2% OR MORE |
| FILM-FORMATION PROPERTY : PARTICLE | LESS THAN 10000 | 10000 OR DEEPER BUT LESS THAN 20000 | 20000 OR MORE |
| CORROSION AMOUNT | LESS THAN 5 $\mu m$ | 5 $\mu m$ OR DEEPER BUT LESS THAN 10 $\mu m$ | 10 $\mu m$ OR DEEPER |

FIG. 14
PRIOR ART

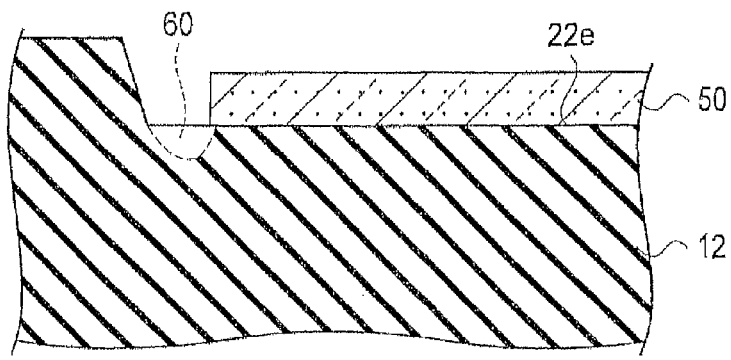

US 8,540,819 B2

CERAMIC HEATER

CROSS-REFERENCE TO RELATED APPLICATIONS

This application is based upon and claims the benefit of priority from prior Japanese Patent Application P2008-74478 filed on Mar. 21, 2008, and Japanese Patent Application P2009-68611 filed on Mar. 19, 2009; the entire contents of which are incorporated by reference herein.

BACKGROUND OF THE INVENTION

1. Field of the Invention

The present invention relates to a ceramic heater used for an electronic-device manufacturing apparatus.

2. Description of the Related Art

In the process of manufacturing electronic devices such as semiconductor devices and liquid crystal devices, high-temperature processes such as chemical vapor deposition (CVD) and surface modification are employed. For example, in CVD, a semiconductor substrate to be processed is mounted on a ceramic heater provided in a reaction chamber of a CVD apparatus. Films such as a semiconductor film and an insulating film are formed on the substrate which is heated by the ceramic heater to a high temperature of approximately 500° C. or higher.

A ceramic heater is produced by bonding a cylindrical shaft to the lower surface of a flat plate made of aluminum nitride (AlN) (see Japanese Patent Application Laid-open No. 2003-142564). A heating element and a electrode for generating plasma are embedded in the plate. The upper surface of the plate serves as a mounting surface on which a substrate is mounted. The ceramic heater is fixed to the reaction chamber by the shaft.

In CVD, a corrosive gas is used as a process gas and a cleaning gas. In order to prevent the corrosive gas from being deposited on an outer edge portion of a substrate, there is a technique of supplying the outer edge portion of the substrate with a purge gas for removing the corrosive gas (see Japanese Patent Application Laid-open No. 2003-142564). Furthermore, in order to prevent a corrosive gas from going around the lower surface of a plate of a ceramic heater, there is also a technique of supplying a purge gas through an opening provided in the side surface of the plate, the purge gas for blocking the corrosive gas (see Japanese Patent No. 3976993).

For example, in plasma CVD, a corrosive gas containing fluorine is used as a process gas and a cleaning gas. In this case, a ceramic heater is exposed to fluorine plasma at a high temperature in a CVD or cleaning process. The fluorine plasma causes AlN of a plate to react with fluorine, and thereby aluminum fluoride ($AlF_3$) is formed. $AlF_3$ starts to sublimate at approximately 450° C. or higher, and accordingly the plate is corroded.

The thickness of the corroded plate is gradually decreased. Particularly, when the upper surface of the plate has a pocket shape, the following problem arises. Herein, a pocket shape refers to a shape formed of: a convex portion provided annularly at the outer edge portion of the upper surface of the plate; and a mounting surface which is surrounded by the convex portion, and on which a substrate is to be mounted.

When the upper surface of the plate has the pocket shape, the vicinity of the side wall of the convex portion provided at the outer edge portion becomes a gas reservoir where the corrosive gas stagnates. Moreover, of the mounting surface, a region formed between the side wall of the convex portion and the outer edge of the mounted substrate is not covered with the substrate, and is thus exposed to fluorine plasma during CVD. For this reason, of the mounting surface, AlN corrosion is significant in a region in the vicinity of the outer edge portion of the substrate, forming a dent in the region. The corroded dent changes the degree of contact between the substrate and the ceramic heater in the region; such a change in the degree of contact causes the temperature distribution in the substrate to be non-uniform. As a result, a problem arises that using the ceramic heater for a long period deteriorates the quality of a film to be formed on the substrate.

Such a problem has heretofore been dealt with the re-grinding of the upper surface of the plate having a dent formed therein. The dent formed due to the corrosion is approximately 10 μm to 100 μm in depth. Thus, the upper surface of the plate needs to be ground at a depth of approximately 100 μm in the re-grinding process.

However, the ceramic heater includes an embedded electrode for generating plasma approximately 1 mm below the upper surface of the plate. By grinding the upper surface of the plate, the thickness of a dielectric layer on the embedded electrode is decreased. This causes problems including: decrease in the resistance of the plate to thermal stress; change in the density of plasma generated in the reaction chamber; change in the temperature uniformity due to decrease in the heat capacity of the ceramic heater along with decrease in the thickness of the plate; and the like.

Meanwhile, sublimated $AlF_3$ is deposited at a low-temperature portion in a form of fine particles. In the semiconductor fabricating process after the CVD process, the fine particles deposited on the back surface of the substrate are separated, which causes particle contamination.

Summary of the Invention

An object of the present invention is to provide a ceramic heater capable of suppressing corrosion at an outer periphery of a substrate-mounting surface of a plate.

A first aspect of the present invention provides a ceramic heater (ceramic heater 100) for a semiconductor substrate process comprising: a mounting plate (plate 10) on which the substrate (substrate 50) is mounted; and a supporter (shaft 36) configured to support the mounting plate. The mounting plate includes a first base (first base 12) and a second base (second base 14). The first base (first base 12) is made of a ceramic sintered body, and has: a mounting surface (mounting surface 12b) on which the substrate is mounted; and a lower surface provided on an opposite side to the mounting surface. The second base (second base 14) is made of a ceramic sintered body, and has: an upper surface bonded to the lower surface of the first base; and a lower surface provided on an opposite side to the upper surface. The supporter is made of a ceramic sintered body, and is bonded to the lower surface of the second base. The supporter includes a first penetration hole (penetration hole 38) penetrating from one end of the supporter to the other end of the supporter. A first region (first region 22), a first groove (purge groove 20) and a second region (second region 23) are defined on the mounting surface. The first region has a first surface contacting with the mounted substrate. The first groove is provided in a portion covered with the substrate and surrounds the first region. The second region has a second surface surrounding the first groove. The first base has: an adsorber configured to adsorb the mounted substrate onto the first surface; and a plurality of holes (purge holes 24) each penetrating from a bottom surface of the first groove to the lower surface of the first base. At least one of the upper surface of the second base and the lower surface of the first base is provided with a second groove (groove 30 and branched grooves 31) connected to each of the plurality of holes. The second base has a second penetration hole (penetration hole 32) connected to the second groove and to the first penetration hole. The first groove is supplied with an inert gas through the first penetration hole, the second penetration hole, the second groove, and the plurality of holes. The second surface of the second region is located lower than the first surface of the first region.

A second aspect of the present invention is the ceramic heater according to the above-described first aspect, wherein, as the adsorber, the first base has a third groove (vacuum chuck groove 28) provided in the first surface, and the third groove is evacuated to hold the substrate on the first region.

A third aspect of the present invention is the ceramic heater according to the above-described first aspect, wherein, as the adsorber, the first base has an annular protrusion (annular protrusion 22a), a bottom surface (bottom surface 22b) surrounded by the annular protrusion and a plurality of embosses (embosses 22c) provided on the bottom surface in the first region, the annular protrusion and the plurality of embosses supporting the substrate, and a space formed by the substrate, the annular protrusion and the bottom surface is evacuated to hold the substrate on the first region.

A fourth aspect of the present invention is the ceramic heater according to the above-described first aspect, wherein, as the adsorber, an electrode (embedded electrode 18) is embedded in the first base, and by applying a DC high voltage to the electrode, an electrostatic adsorption force is generated on the first surface of the first region to hold the substrate on the first region.

A fifth aspect of the present invention is the ceramic heater according to the above-described first aspect, wherein, when the substrate has a diameter of 300 mm, the first groove has a width (width Wt) ranging between 0.5 mm and 4 mm, the first groove has a depth (depth Tt) ranging between 0.025 mm to 0.25 mm, a distance between the first surface of the first region and the second surface of the second region (surface-to-surface distance Tg) ranges between 0.01 mm to 1 mm, each of the plurality of holes has a diameter (diameter D) ranging between 0.25 mm and 2 mm, a diameter (PCD) of a circle connecting the respective centers of the plurality of holes to each other ranges between 280 mm and 299 mm, and the number of the holes is 8 to 48.

A sixth aspect of the present invention is the ceramic heater according to the above-described first to third and fifth aspects, further comprising: a heating element (heating element 16) provided in the first base; and an embedded electrode (embedded electrode 18) provided between the mounting surface of the first base and the heating element.

A seventh aspect of the present invention is the ceramic heater according to the above-described fourth aspect, further comprising a heating element (heating element 16) provided in the first base, wherein the electrode is provided between the mounting surface of the first base and the heating element.

According to the present invention, it is possible to provide a ceramic heater capable of suppressing corrosion at an outer periphery of a substrate-mounting surface of a plate.

BRIEF DESCRIPTION OF THE DRAWINGS

FIG. 11 is a table showing one example of results of an evaluation of the ceramic heater 100 according to the embodiment of the present invention.

FIG. 12 is a table showing one example of parameter values used in the evaluation of the ceramic heater 100 according to the embodiment of the present invention.

FIG. 13 is a table showing one example of evaluation criteria for the ceramic heater 100 according to the embodiment of the present invention.

FIG. 14 is a cross-sectional view showing one example of corrosion of the ceramic heater 200 according to Comparative Example.

DETAILED DESCRIPTION OF THE INVENTION

Figure 1:
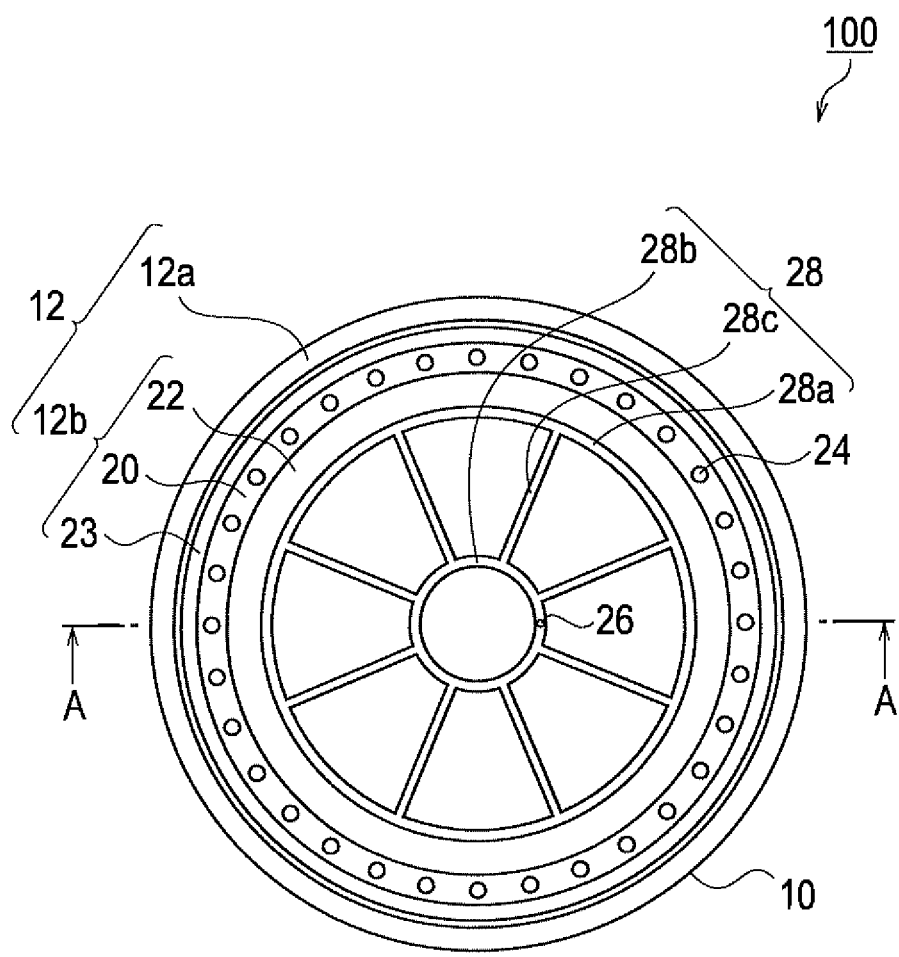
FIG. 1 is a plan view showing one example of a ceramic heater 100 according to an embodiment of the present invention.

Hereinafter, an embodiment of the present invention will be described with reference to the drawings. In the following description on the drawings, the identical or similar components are denoted by the identical or similar reference symbols. However, it should be noted that the drawings are schematic, and that the relations between the thicknesses and the planar dimensions, the ratios of thicknesses among layers, and the like differ from the actual ones. Accordingly, the specific thicknesses and dimensions should be determined on the basis of the following description. In addition, it goes without saying that relationships and proportions of dimensions between the drawings may be different in some parts.

Overview of Embodiment

A ceramic heater according to the embodiment includes: a plate on which a substrate is mounted; and a shaft configured to support the plate. The plate includes a first base and a second base. The first base has: a mounting surface on which a substrate is mounted; and a lower surface provided on the opposite side to the mounting surface. The second base has: an upper surface bonded to the mounting surface of the first base; and a lower surface provided on the opposite side to the upper surface. The shaft is bonded to the lower surface of the second base, and has a penetration hole penetrating from one end of the shaft to the other end thereof.

A first region, a purge groove, and a second region are defined on the mounting surface of the first base. The first region has a surface that comes into contact with the substrate to be mounted thereon. The purge groove is provided in a portion to be covered with the substrate so as to surround the first region. The second region has a surface surrounding the purge groove.

The first base according to the embodiment has a vacuum chuck groove. The vacuum chuck groove is provided in the surface of the first base. Specifically, the vacuum chuck groove is an adsorber configured to adsorb the substrate onto the surface of the first base.

The first base further has multiple purge holes each penetrating from the bottom surface of the purge groove to the lower surface of the first base. The second base has a passage connected to each of the multiple purge holes provided in the first base. The purge groove is supplied with an inert gas through the penetration hole provided in the shaft, the passage provided in the second base, and the multiple purge holes.

Here, in the ceramic heater according to the embodiment, the surface of the second region is located lower than that of the first region.

With the above-described structure, the inert gas supplied to the purge groove flows through a gap between the surface of the second region and the back surface, in the vicinity of the outer edge of the substrate. The inert gas then flows along the mounting surface of the first base toward the convex portion provided on the outer periphery of the mounting surface of the first base. Thereby, in a plasma CVD process or other processes, a corrosive gas can be removed from the vicinity of the outer edge of the substrate and from the outer edge portion of the mounting surface of the first base. Particularly, when the convex portion is provided on the outer periphery of the mounting surface of the first base, a corrosive gas stagnating in the vicinity of a side wall of the convex portion can be efficiently removed. As a result, the corrosion occurring on the surface, on which the substrate is mounted, of the plate (particularly, corrosion occurring at the outer periphery of the mounting surface) can be suppressed.

It should be noted that, although exemplified is a case where the vacuum chuck groove is used as the adsorber in the embodiment, the adsorber is not limited to the vacuum chuck groove. Other embodiments of the adsorber will be described in detail in Modification Examples 1, 2 of the embodiment.

Embodiment (1) Structure of Ceramic Heater

Hereinafter, a structure of the ceramic heater according to the embodiment of the present invention will be described with reference to the drawings.

(1.1) Schematic Structure of Ceramic Heater

Figure 2:
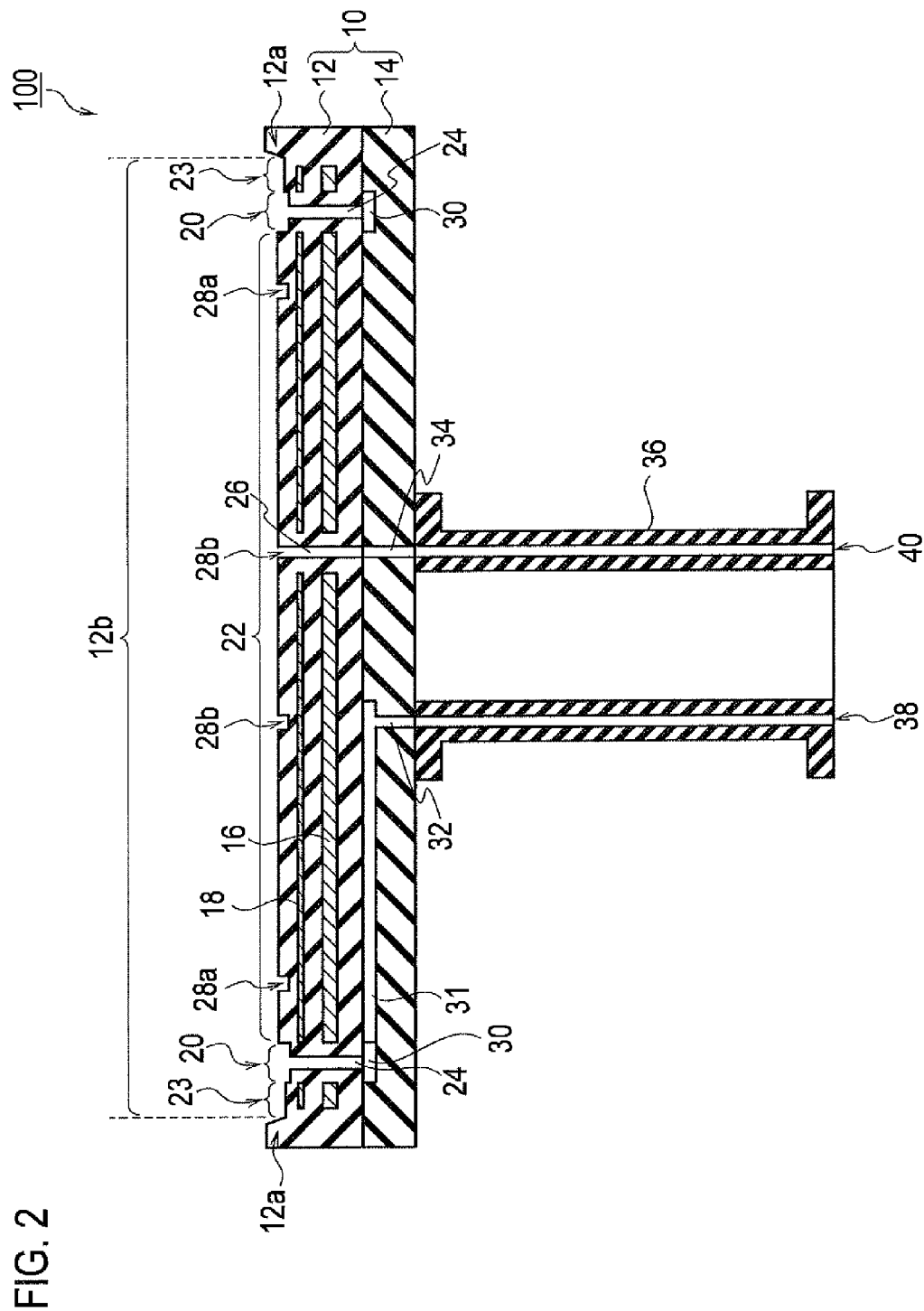
FIG. 2 is a schematic diagram showing the cross-section of the ceramic heater 100 taken along the line A-A in FIG. 1.

FIG. 1 is a plan view showing one example of a ceramic heater 100 according to the embodiment the present invention. FIG. 2 is a schematic diagram showing the cross-section of the ceramic heater 100 shown in FIG. 1 taken along the line A-A. As shown in FIGS. 1 and 2, the ceramic heater 100 includes: a plate 10 on which a substrate (unillustrated) is mounted; a shaft 36 configured to support the plate 10; and the like. The plate 10 includes a first base 12 and a second base 14. The upper surface of the second base 14 is bonded to the lower surface of the first base 12. One end of the shaft 36 is bonded to the lower surface of the second base 14. Note that, hereinafter, one end of the shaft 36 refers to one of the end portions of the shaft 36, which is bonded to the lower surface of the second base 14.

Figure 4:
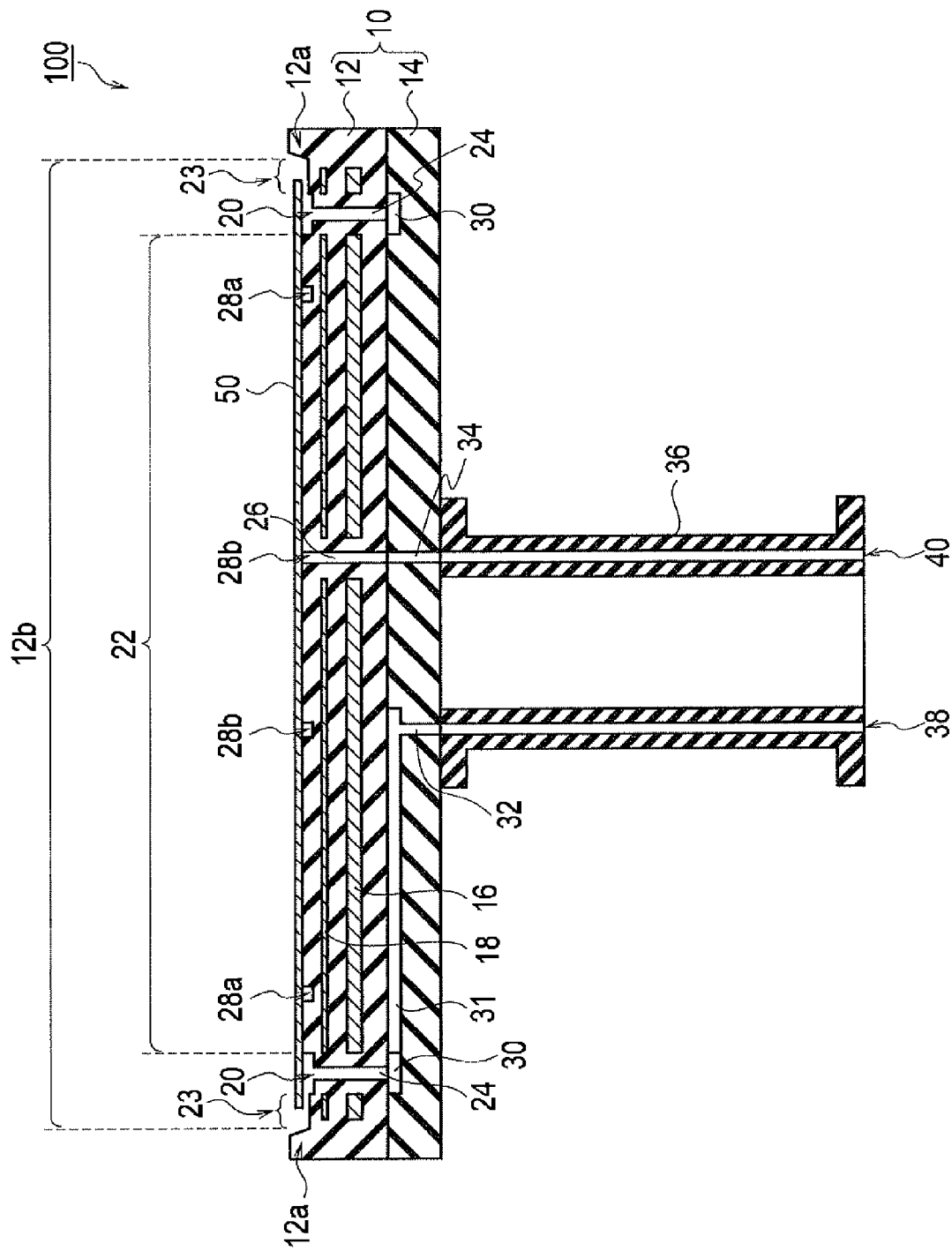
FIG. 4 is a view showing a state where a substrate 50 is mounted on the ceramic heater 100 shown in FIG. 2.

A heating element 16 and an embedded electrode 18 are embedded in the first base 12. The embedded electrode 18 is provided between the upper surface of the first base 12 and the heating element 16. As shown in FIG. 4 to be described later, a substrate 50 to be processed is mounted on the upper surface of the first base 12. The ceramic heater 100 is fixed to a reaction chamber (unillustrated) of a plasma CVD apparatus or the like by the cylindrical shaft 36.

For example, the plate 10 is disc shaped if the substrate is a round semiconductor substrate. The substrate is heated by the heating element 16. The embedded electrode 18 is applied with a high frequency from a high-frequency power source (unillustrated) to thereby generate plasma in the reaction chamber. The heating element 16 and the embedded electrode 18 are respectively connected to electrode terminals (unillustrated). Incidentally, the shape of the ceramic heater 100 is not limited to a disc shape, and may be, for example, a polygonal shape.

(1.2) First Base

As shown in FIG. 2, the upper surface of the first base 12 has a pocket shape. Specifically, the upper surface of the first base 12 includes: a convex portion 12a annularly provided at the outer edge portion of the upper surface of the first base 12; and a mounting surface 12b surrounded by the convex portion 12a. The mounting surface 12b is a region where the substrate (unillustrated) is to be mounted. A first region 22, a purge groove 20 and a second region 23 are defined on the mounting surface 12b of the substrate.

The first region 22 is provided at a central portion of the mounting surface 12b. The surface of the first region 22 comes into contact with the substrate. The surface of the first region 22 is preferably a horizontal surface.

The purge groove 20 is annularly provided to surround the first region 22. The purge groove 20 is provided to be covered with the mounted substrate. Note that the purge groove 20 corresponds to a first groove.

The second region 23 is annularly provided to surround the purge groove 20. In other words, the second region 23 has a surface surrounding the purge groove 20. The surface of the second region 23 is preferably a horizontal surface. The surface of the second region 23 is located lower than that of the first region 22.

Incidentally, when the upper surface of the first base 12 has the pocket shape, the effects and advantages of the present invention can be obtained more effectively. Nevertheless, the effects and advantages of the present invention can be obtained without the pocket shape.

The first base 12 has a vacuum chuck groove 28, a first exhaust hole 26, and multiple purge holes 24.

The vacuum chuck groove 28 is provided in a part of the surface of the first region 22. The vacuum chuck groove 28 is one example of an adsorber configured to adsorb a substrate onto the mounting surface 12b. Particularly, the vacuum chuck groove 28 is one example of an adsorber configured to adsorb the substrate onto the surface of the first region 22. The vacuum chuck groove 28 has: an outer annular groove 28a and an inner annular groove 28b which are provided in the form of concentric circles; and radial grooves 28c. The outer annular groove 28a and the inner annular groove 28b are linked with each other by the radial grooves 28c. The inner annular groove 28b is connected to the first exhaust hole 26. Incidentally, the planar pattern of the vacuum chuck groove 28 is not limited to the shape shown in FIG. 1.

The first exhaust hole 26 penetrates from the bottom surface of the vacuum chuck groove 28 to the lower surface of the first base 12. The first exhaust hole 26 is connected to a second exhaust hole 34 (to be described later) provided in the second base 14. Furthermore, the second exhaust hole 34 is connected to a third exhaust hole 40 (to be described later) provided in the shaft 36. The vacuum chuck groove 28 is evacuated by a vacuum system (unillustrated) connected thereto through the first exhaust hole 26, the second exhaust hole 34 and the third exhaust hole 40. Thereby, a vacuum chuck holds the substrate to the first region 22 on the upper surface of the first base 12.

The multiple purge holes 24 each penetrate from the bottom surface of the purge groove 20 to the lower surface of the first base 12. As shown in FIG. 2, each of the purge holes 24 is connected to an annular groove 30 (to be described later) provided in the upper surface of the second base 14. Furthermore, the groove 30 is connected to branched grooves 31 (to be described later) provided in the second base 14. Moreover, the branched grooves 31 are connected to a penetration hole 32 (to be described later) provided in the second base 14. The penetration hole 32 is connected to a penetration hole 38 (to be described later) provided in the shaft 36. The branched grooves 31, the penetration hole 32 and the penetration hole 38 will be described in detail later. The purge groove 20 is supplied with an inert gas from a purge-gas supply source (unillustrated) connected thereto through the purge holes 24, the groove 30, the branched grooves 31, the penetration hole 32 and the penetration hole 38. Note that, hereinafter, an inert gas is referred to as a purge gas. As a purge gas, $N_2$, Ar, and the like can be used, but the purge gas is not limited to these.

(1.3) Second Base

Figure 3:
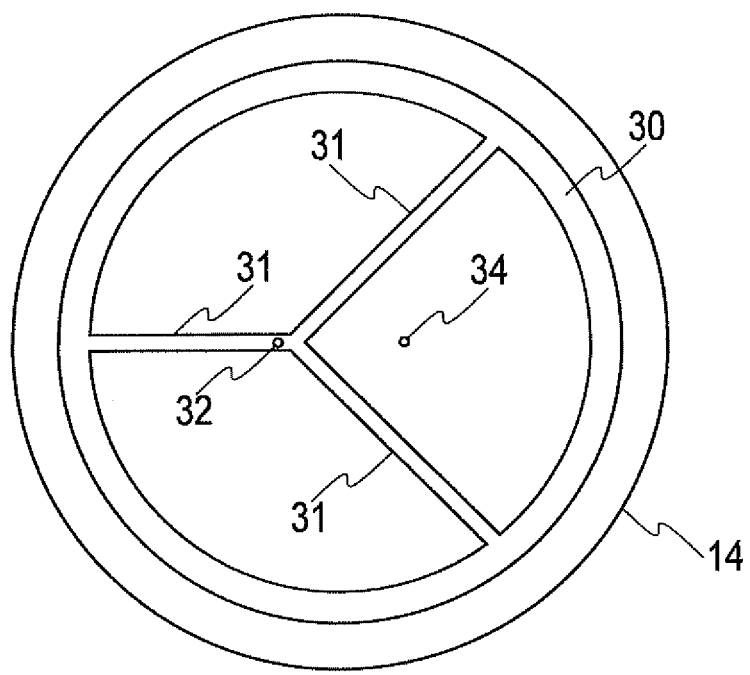
FIG. 3 is one example of a top view of a second base 14 of the ceramic heater 100 according to the embodiment of the present invention.

FIG. 3 is one example of a top view of the second base 14 of the ceramic heater 100 according to the embodiment of the present invention. As shown in FIGS. 2 and 3, the second base 14 has the groove 30, the branched grooves 31, the penetration hole 32 and the second exhaust hole 34.

The groove 30 and the branched grooves 31 are provided in the upper surface of the second base 14. The annular groove 30 is connected to the three branched grooves 31 extending radially. The branched grooves 31 are connected to the penetration hole 32 (second penetration hole) that penetrates from the bottom surface of one of the branched grooves 31 to the lower surface of the second base 14. Furthermore, the penetration hole 32 is connected to the penetration hole 38 (first penetration hole; to be described later) provided in the shaft 36. Note that the groove 30 and the branched grooves 31 correspond to a second groove.

The second exhaust hole 34 penetrates from the upper surface of the second base 14 to the lower surface thereof. The second exhaust hole 34 is connected to the first exhaust hole 26 provided in the first base 12 and to the third exhaust hole 40 (to be described later) provided in the shaft 36.

Incidentally, the three branched grooves 31 branched in the vicinity of the penetration hole 32 as shown in FIG. 3 are used in the description of the embodiment. Nevertheless, the number of branched grooves is not limited, and one or more branched grooves can be used. Meanwhile, the groove 30 may be provided in the lower surface of the first base 12. Alternatively, the groove 30 may be provided in each of the lower surface of the first base 12 and the upper surface of the second base 14.

(1.4) Shaft

As shown in FIG. 2, the shaft 36 has the penetration hole 38 (first penetration hole) and the third exhaust hole 40.

The penetration hole 38 penetrates from the one end of the shaft 36 to the other end thereof. One end of the penetration hole 38 is connected to the penetration hole 32 provided in the second base 14. The penetration hole 38 connects the other end of the shaft 36 to the purge-gas supply source (unillustrated) for supplying a purge gas.

The third exhaust hole 40 penetrates from the one end of the shaft 36 to the other end thereof. One end of the third exhaust hole 40 is connected to the second exhaust hole 34 provided in the second base 14. The third exhaust hole 40 connects the other end of the shaft 36 to the vacuum system (unillustrated) for evacuating the vacuum chuck groove 28 provided in the first base 12.

In essence, in the ceramic heater 100 according to the embodiment of the present invention, while the substrate is held by the vacuum chuck, the purge groove 20 is supplied with a purge gas from the purge-gas supply source through the penetration hole 38, the penetration hole 32, the branched grooves 31, the groove 30 and the purge holes 24. As described above, the purge groove 20 is provided to be covered with the mounted substrate. Additionally, the surface of the second region 23 is located lower than that of the first region 22. As a result, the purge gas supplied to the purge groove 20 is ejected substantially horizontally through a gap between the surface of the second region 23 and the back surface, in the vicinity of the outer edge, of the substrate. The purge gas then flows along the upper surface of the first base 12 toward the convex portion 12a provided at the outer edge portion of the upper surface of the first base 12. Thus, in a plasma CVD process or other processes, it is possible to remove a corrosive gas stagnating in the vicinity of the outer edge of the substrate and in the vicinity of the side wall of the convex portion 12a provided at the outer edge portion of the upper surface of the first base 12. As a result, the upper surface of the first base 12 is prevented from corrosion.

(1.5) Materials

As the first and second bases 12 and 14 of the plate 10 as well as the shaft 36, used is a ceramic sintered body such as aluminum nitride (AlN), alumina ($Al_2O_3$), silicon nitride ($Si_3N_4$), silicon carbide (SiC) and boron nitride (BN). As the heating element 16 and the embedded electrode 18, used is a conductive material such as a high-melting-point metal or high-melting-point metal carbide. Here, examples of the high-melting-point metal include tungsten (W), molybdenum (Mo) and niobium (Nb), and an example of the high-melting-point metal carbide includes tungsten carbide (WC).

(1.6) Purge Groove and Purge Hole

Figure 5:
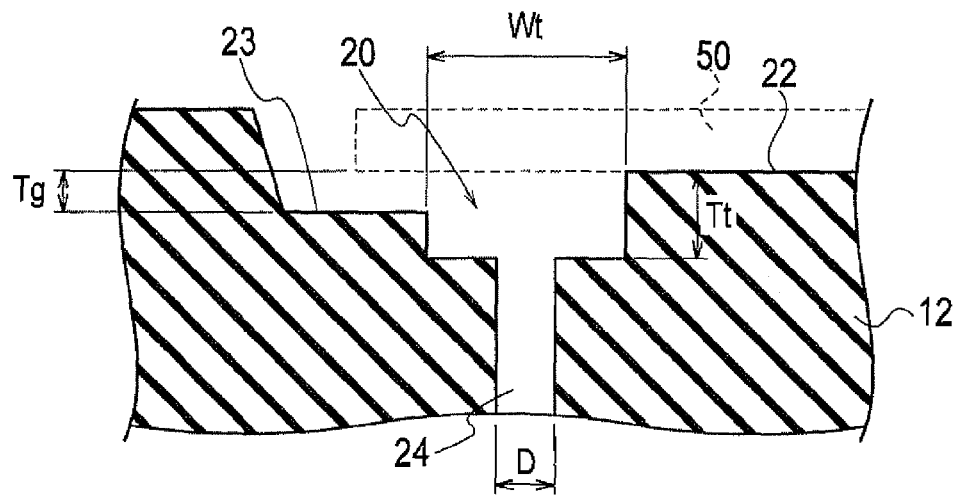
FIG. 5 is an exemplar enlarged partial view of FIG. 4.

FIG. 4 is a view showing a state where the substrate 50 is mounted on the ceramic heater 100 shown in FIG. 2. FIG. 5 is one example of an enlarged partial view of FIG. 4.

For example, the diameter of the substrate 50 is set to 300 mm, and the outer diameter of the plate 10 is set to approximately 330 mm to 340 mm. As shown in FIG. 4, Wt denotes the width of the purge groove 20; Tt denotes the depth of the purge groove 20 from the surface of the first region 22; Tg denotes the distance between the surface of the first region 22 and the surface of the second region 23 (hereinafter, referred to as a surface-to-surface distance between the first region 22 and the second region 23); and D denotes the diameter of the purge hole 24.

Moreover, hereinafter, the diameter of a circle connecting the respective centers of the multiple purge holes 24 to each other is referred to as a pitch circle diameter (PCD) of the purge holes 24. In this respect, each center of the purge holes 24 is preferably located on the centerline in the width direction of the purge groove 24. In this case, the pitch circle diameter (PCD) of the purge holes 24 is substantially the same as the diameter of a circle that passes through the centerline in the width direction of the purge groove 20. Moreover, the multiple purge holes 24 are desirably arranged at approximately equal intervals on the circle connecting the respective centers of the multiple purge holes 24 to each other.

By setting the dimension of each component as described below, a purge gas accumulated in a space inside the annularly-formed purge groove 20 is ejected toward the convex portion 12a uniformly through the gap between the substrate 50 and the mounting surface 12b of the first base 12 (particularly, the surface of the second region 23). Thereby, the effects of the invention of the present application are exerted significantly.

The width Wt of the purge groove 20 is desirably in a range between 0.5 mm and 4 mm. If the width Wt is less than 0.5 mm, the pressure of a supplied purge gas increases, thus causing the substrate 50 to float. On the other hand, if the width Wt exceeds 4 mm, the substrate 50 above the purge groove 20 is heated insufficiently, which deteriorates the temperature uniformity.

The depth Tt of the purge groove 20 is desirably in a range between 0.025 mm and 0.25 mm. If the depth Tt is less than 0.025 mm, the pressure of a supplied purge gas increases, which causes the substrate 50 to float and thereby deteriorates the temperature uniformity. On the other hand, if the depth Tt exceeds 0.25 mm, the substrate 50 above the purge groove 20 is heated insufficiently, which deteriorates the temperature uniformity.

The surface-to-surface distance Tg between the first region 22 and the second region 23 is desirably in a range between 0.01 mm and 0.1 mm. If the surface-to-surface distance Tg is less than 0.01 mm, the surface of the first region 22 is located substantially at the same level as that of the second region 23 as in Comparative Example to be described later. Accordingly, the substrate 50 partially comes into contact with the surface of the second region 23. For this reason, a purge gas cannot uniformly flow toward the outer edge portion of the first base 12 from the back surface side, in the vicinity of the outer edge, of the substrate 50. To put it differently, the flow of the purge gas is partially blocked by the contact portion between the substrate 50 and the surface of the second region 23; thus, a corrosive gas stays in the vicinity of the side wall of the convex portion 12a provided at the outer edge portion of the first base 12. As a result, a part of the surface in a region of the second region 23 is corroded, the region formed between the outer edge of the substrate 50 and the convex portion 12a of the first base 12 by the staying corrosive gas. On the other hand, if the surface-to-surface distance Tg exceeds 0.1 mm, the purge gas is ejected in a non-uniform manner from the gap between the surface of the second region 23 and the back surface, in the vicinity of the outer edge, of the substrate 50; more specifically, the amount of the purge gas ejected from the vicinity of the purge holes 24 is increased. Furthermore, the surface-to-surface distance Tg exceeding 0.1 mm adversely affects the temperature uniformity of the substrate 50.

The diameter D of the purge hole 24 is desirably in a range between 0.25 mm and 2 mm. If the diameter D is less than 0.25 mm, a purge gas cannot flow at a sufficient flow rate, thus resulting in insufficient removal (purge) of a corrosive gas. On the other hand, if the diameter D exceeds 2 mm, a purge gas cools the outer periphery of the substrate 50, which deteriorates the temperature uniformity of the outer periphery thereof.

The PCD of the purge holes 24 is desirably in a range between 280 mm and 299 mm. If the PCD is less than 280 mm, a purge gas is supplied to the vicinity of a central region of the substrate 50, which deteriorates the temperature uniformity. On the other hand, if the PCD exceeds 299 mm, the gap portion sandwiched between the back surface of the substrate 50 and the surface of the second region 23 is narrowed. This makes it difficult for a purge gas to flow toward the convex portion 12a provided at the outer edge portion of the upper surface of the first base 12. This, in turn, makes it easier for a corrosive gas to flow from the outer edge of the substrate toward the center thereof. As a result, the corrosive gas goes around the back surface of the substrate 50, thereby corroding the upper surface of the first base 12. Accordingly, the quality of a film to be formed on the substrate 50 is deteriorated.

The number of the purge holes 24 is desirably in a range between 8 and 48. If the number of the purge holes 24 is less than 8, a purge gas cannot be supplied uniformly to the entire outer periphery of the substrate 50, which deteriorates the temperature uniformity of the outer periphery of the substrate 50. Moreover, a corrosive gas is non-uniformly removed (purged), and therefore corroding non-uniformly the plate 10. As a result, not only the quality of a film to be formed on the substrate 50 is deteriorated, but also the lifetime of the plate 10 is shortened. On the other hand, if the number of the purge holes 24 exceeds 48, a purge gas significantly cools the substrate 50 above the purge groove 20, thus adversely affecting the temperature uniformity.

In addition, the flow rate of the purge gas is desirably in a range between 10 sccm and 500 sccm so as to prevent the substrate 50 from floating.

(2) Method for Producing Ceramic Heater

Next, the outline of a method for producing a ceramic heater will be described with reference to FIGS. 1 to 3.

(2.1) Formation of First Base

First, a first base 12 is formed. Specifically, a first disc-shaped AlN ceramic sintered body in which a heating element 16 and an embedded electrode 18 are embedded is prepared. As the first AlN ceramic sintered body, for example, a sintered body having a diameter of 335 mm is prepared.

Then, as shown in FIGS. 1 and 2, by a machining process using a machining center (MC processing), a round opening is formed in one of the main surfaces of the first AlN ceramic sintered body, which is closer to the embedded electrode 18. For example, the diameter of the bottom surface of the opening is set to 301 mm, and the depth of the opening is set to 0.5 mm to 1 mm. Note that the opening corresponds to a mounting surface 12b, while the outer side of the opening corresponds to a convex portion 12a. Moreover, hereinafter, one of the main surfaces of the first AlN ceramic sintered body, in which the opening is formed, is referred to as an upper surface, while a surface provided on the opposite side to the upper surface is referred to as a lower surface.

Subsequently, a purge groove 20 is annularly formed in the bottom surface of the opening. For example, the width and the depth of the purge groove 20 are set to 2 mm and 0.08 mm, respectively. The diameter of a circle passing through the centerline in the width direction of the purge groove 20 is set to, for example, 290 mm. Note that a region formed at the inner side of the purge groove 20 corresponds to a first region 22, while a region formed at the outer side of the purge groove 20 corresponds to a second region 23. Then, a vacuum chuck groove 28 is formed in a region at the inner side of the purge groove 20. For example, the following grooves are formed as the vacuum chuck groove 28: an outer annular groove 28a and an inner annular groove 28b which are provided in the form of concentric circles; and radial grooves 28c which link the outer annular groove 28a with the inner annular groove 28b. Thereby, the first region 22 is formed. Incidentally, the step of forming the vacuum chuck groove 28 may be performed prior to the step of forming the purge groove 20.

Thereafter, the surface of a region located at the outer side of the purge groove 20 is ground to be located lower than the surface of the first region 22 by 0.05 mm. In this manner, the second region 23 is formed.

After that, multiple purge holes 24 are formed. Each purge hole 24 penetrates from the bottom surface of the purge groove 20 to the lower surface of the first AlN ceramic sintered body. At this point, the multiple purge holes 24 are formed so that, for example, a circle passing through the centerline in the width direction of the purge groove 20 can coincide with a circle connecting the respective centers of the multiple purge holes 24. The number of the purge holes 24 is 36, for example.

Furthermore, an exhaust hole 26 is formed which penetrates from the bottom surface of the vacuum chuck groove 28 to the lower surface of the first AlN ceramic sintered body.

In this manner, the first base 12 is formed.

(2.2) Formation of Second Base

Next, a second base 14 is formed. Specifically, first, a second AlN ceramic sintered body is prepared. The second AlN ceramic sintered body to be prepared is desirably an AlN ceramic sintered body having substantially identical dimensions to that of the first AlN ceramic sintered body used to form the first base. As the second AlN ceramic sintered body, for example, a disc-shaped AlN ceramic sintered body having a diameter of 335 mm is prepared.

Then, as shown in FIGS. 2 and 3, by the MC processing, an annular groove 30 and branched grooves 31 connected to the groove 30 are formed in one main surface of the second AlN ceramic sintered body. The diameter of a circle passing through the centerline in the width direction of the groove 30 is set to, for example, 290 mm. Note that, hereinafter, one of the main surfaces of the second AlN ceramic sintered body, in which the groove 30 and the branched grooves 31 are formed, is referred to as an upper surface, while a surface provided on the opposite side to the upper surface is referred to as a lower surface.

Subsequently, a penetration hole 32 is formed. The penetration hole 32 penetrates from the bottom surface of each branched groove 31 to the lower surface of the second AlN ceramic sintered body. Furthermore, an exhaust hole 34 is formed at a position corresponding to the exhaust hole 26 in the first base 12. The exhaust hole 34 penetrates from the upper surface of the second AlN ceramic sintered body to the lower surface thereof.

In this manner, the second base 14 is formed. Incidentally, the process of forming the second base 14 may be performed prior to the process of forming the first base 12.

(2.3) Formation of Plate

Next, the first base 12 is bonded to the second base 14. Specifically, the first base 12 overlaps the second base 14, and the first base 12 and the second base 14 are bonded to each other by solid-state diffusion bonding. At this point, the exhaust hole 26 formed in the first base 12 is connected to the exhaust hole 34 formed in the second base 14. By bonding the first base 12 and the second base 14, the purge holes 24 are connected to the groove 30. In other words, each of the multiple purge holes 24 is connected to the groove 30. In this manner, a plate 10 is formed.

(2.4) Formation of Shaft

Next, a shaft 36 is formed. A third cylindrical AlN ceramic sintered body is prepared. Then, by the MC processing, a penetration hole 38 and an exhaust hole 40 are formed. These holes each penetrate from one end of the third AlN ceramic sintered body to the other end thereof. The penetration hole 38 and the exhaust hole 40 are formed at positions respectively corresponding to the penetration hole 32 and the exhaust hole 34 which are formed in the second base 14. In this manner, the shaft 36 is formed. Incidentally, the process of forming the shaft 36 may be performed prior to the process of forming the first base 12, the process of forming the second base 14, or the process of bonding the first base 12 and the second base 14.

(2.5) Bonding of Plate and Shaft

Lastly, the plate 10 is bonded to the shaft 36. Specifically, the plate 10 overlaps the shaft 36, and the shaft 36 is bonded to the lower surface of the second base 14 by the solid-state diffusion bonding. At this point, the penetration hole 38 formed in the shaft 36 is connected to the penetration hole 32 formed in the second base 14, and the exhaust hole 40 formed in the shaft 36 is connected to the exhaust hole 34 formed in the second base 14.

In this manner, a ceramic heater 100 shown in FIGS. 1 and 2 is produced.

Modification Example 1

Hereinafter, a ceramic heater 100 according to Modification Example 1 of the embodiment of the present invention will be described.

In the above-described embodiment of the present invention, the description has been given of the case where the first base 12 has the vacuum chuck groove 28 configured to vacuum-adsorb a substrate onto the mounting surface 12b. However, the present invention is not limited to this. For example, a space larger than the vacuum chuck groove 28 may be formed between the substrate and the mounting surface 12b as a space to be evacuated.

Figure 6:
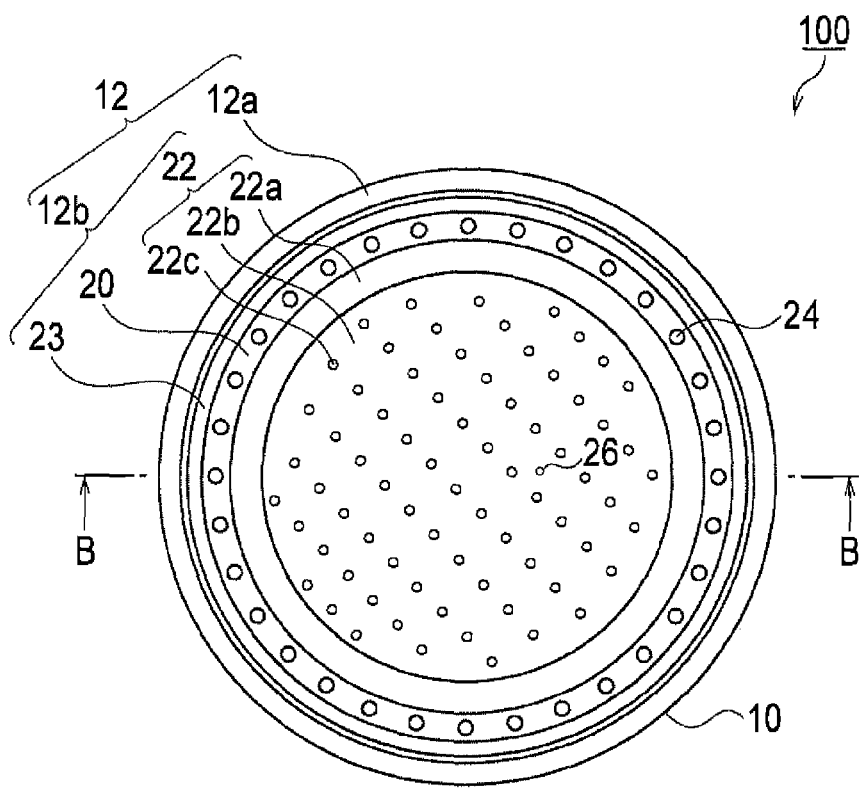
FIG. 6 is a plan view of a ceramic heater 100 according to Modification Example 1 of the present invention.
Figure 7:
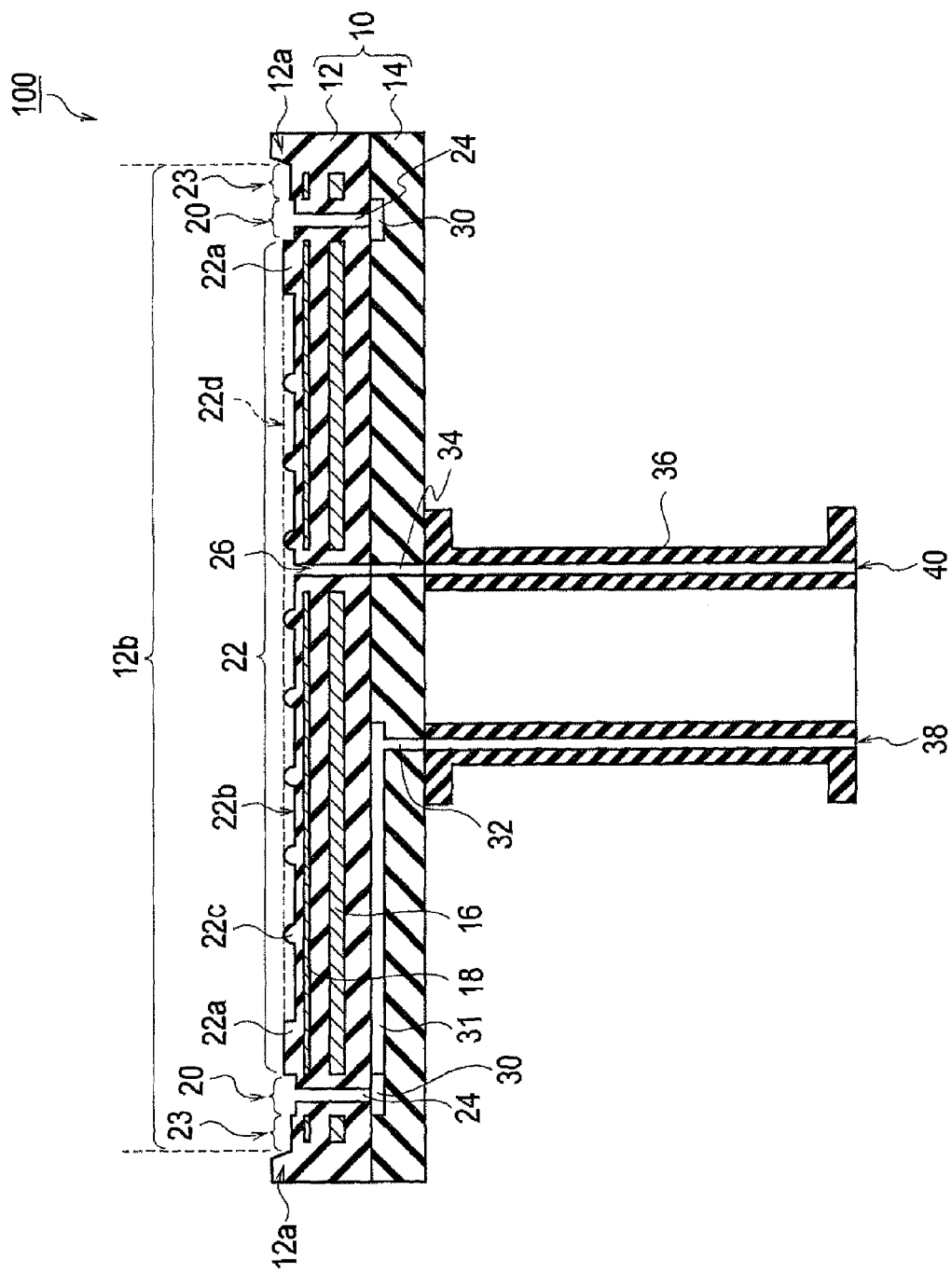
FIG. 7 is a schematic diagram showing the cross-section of the ceramic heater 100 shown in FIG. 6 taken along the line B-B.

The structure of the ceramic heater 100 according to Modification Example 1 will be described with reference to FIGS. 6 and 7. FIG. 6 is a plan view showing the ceramic heater 100 according to Modification Example 1. FIG. 7 is a schematic diagram showing the cross-section of the ceramic heater 100 shown in FIG. 6 taken along the line B-B. Hereinafter, description will be mainly given of the difference between the above-described embodiment and Modification Example 1.

As shown in FIGS. 6 and 7, the first base 12 has an annular protrusion 22a, a bottom surface 22b surrounded by the annular protrusion 22a and multiple embosses 22c provided on the bottom surface 22b, in the first region 22.

The annular protrusion 22a is annularly provided along the outer edge of the first region 22. The annular protrusion 22a is configured to support a substrate to be mounted on the first region 22. Incidentally, FIG. 7 shows a case where the annular protrusion 22a has a horizontal surface; however, the form of the annular protrusion 22a is not limited to this. The annular protrusion 22a may have a curved surface.

The multiple embosses 22c are provided on the bottom surface 22b which is a inner region of the annular protrusion 22a, in the first region 22. The multiple embosses 22c are configured to support the substrate to be mounted on the first region 22. Incidentally, FIG. 7 shows a case where each of the multiple embosses 22c is formed to have a curved surface; however, the form of the protrusion 22c is not limited to this. Each protrusion 22c may have a horizontal surface.

Note that the annular protrusion 22a, the bottom surface 22b and the multiple embosses 22c are one example of an adsorber configured to adsorb a substrate onto the mounting surface 12b.

As shown in FIG. 7, the contact point between the annular protrusion 22a and the substrate as well as the contact point between each of the multiple embosses 22c and the substrate are provided on a plane 22d. As shown in FIG. 7, the surface of the second region 23 is located lower than the plane 22d formed of the contact point between the annular protrusion 22a and the substrate as well as the contact point between each protrusion 22c and the substrate.

When a substrate is mounted on the first region 22, a space is formed by the annular protrusion 22a, the bottom surface 22b, each protrusion 22c and the substrate. The space thus formed is evacuated by a vacuum system (unillustrated) connected thereto through the first exhaust hole 26, the second exhaust hole 34 and the third exhaust hole 40. Thereby, the mounted substrate is held on the mounting surface 12b by the vacuum chuck.

The other structure is the same as that of the embodiment described above. Thus, this Modification Example 1 also prevents the upper surface of the first base 12 from corrosion.

Modification Example 2

Hereinafter, a ceramic heater 100 according to Modification Example 2 of the embodiment of the present invention will be described.

In the above-described embodiment of the present invention, the description has been given of the case where the vacuum chuck is used to hold a substrate on the mounting surface 12b. However, the present invention is not limited to this. For example, an electrostatic chuck may be used to hold a substrate on the mounting surface 12b.

Figure 8:
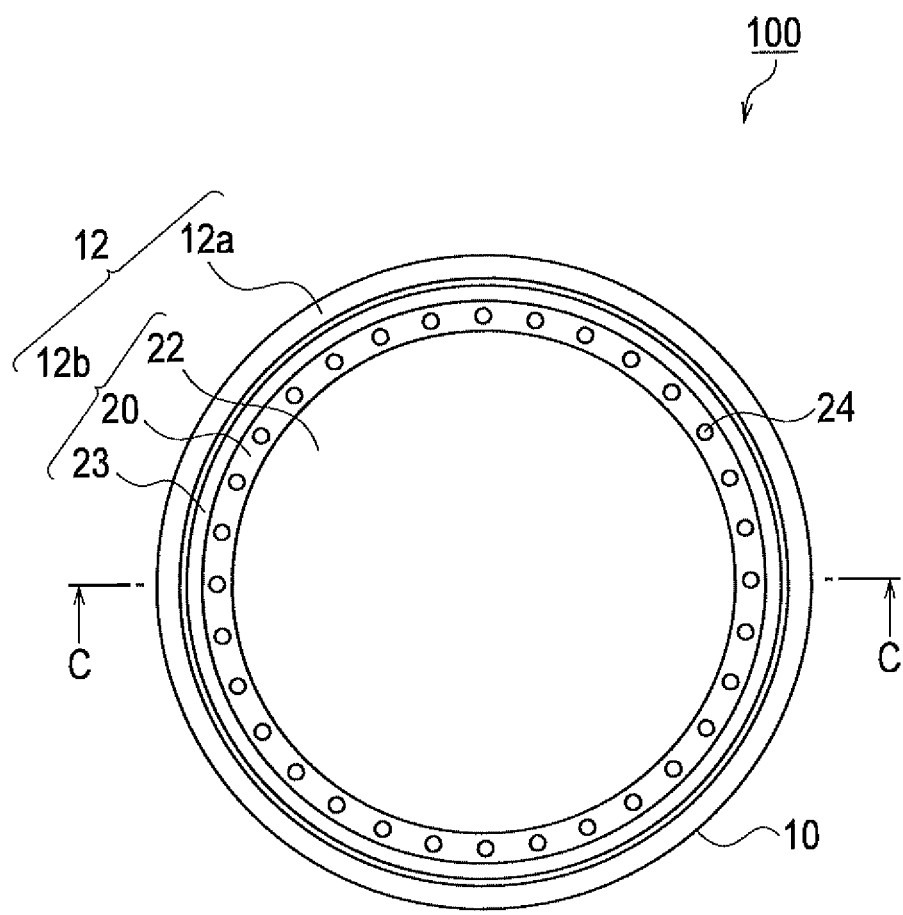
FIG. 8 is a plan view of a ceramic heater 100 according to Modification Example 2 of the present invention.
Figure 9:
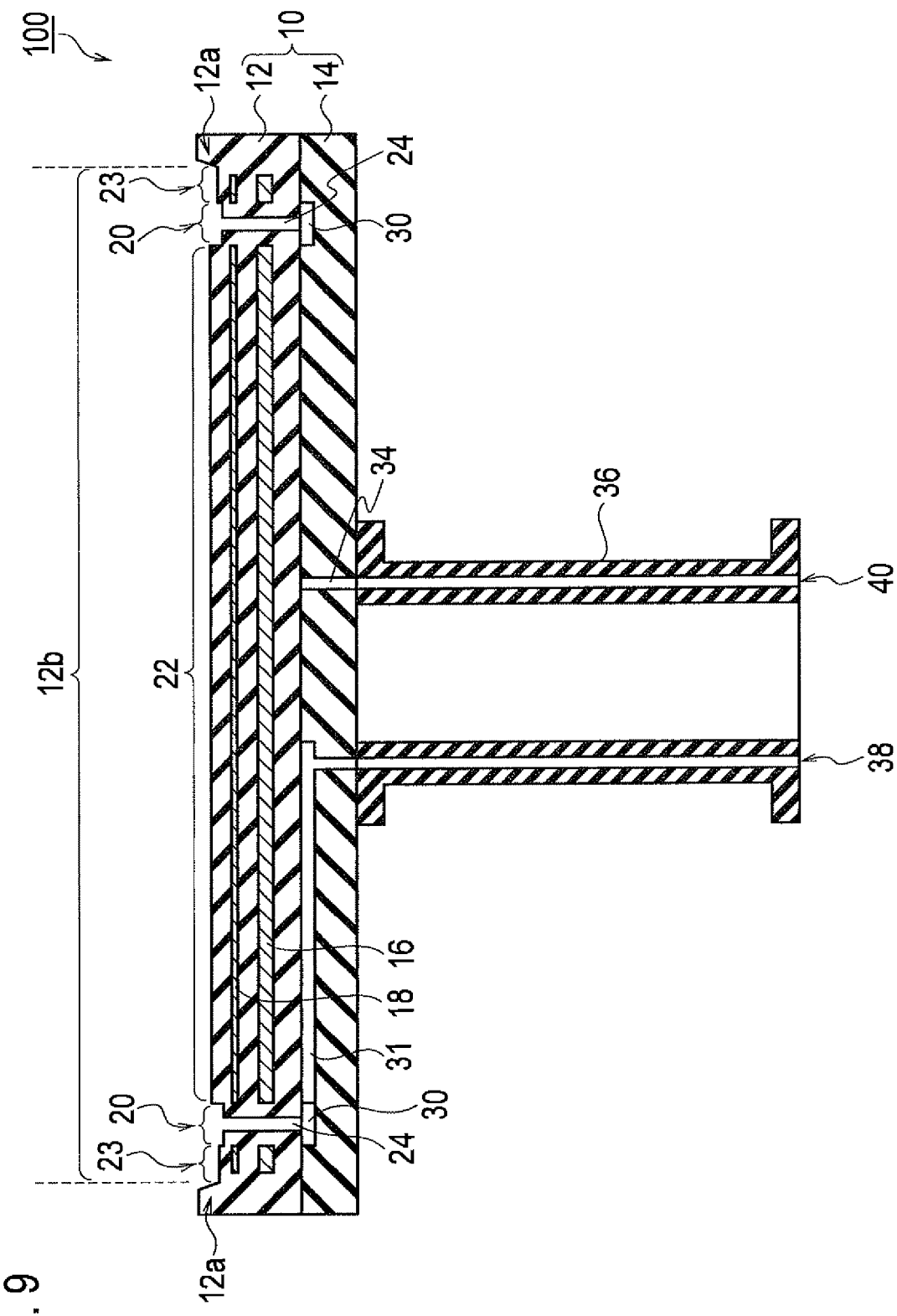
FIG. 9 is a schematic diagram showing the cross-section of the ceramic heater 100 shown in FIG. 8 taken along the line C-C.

The structure of the ceramic heater 100 according to Modification Example 2 will be described with reference to FIGS. 8 and 9. FIG. 8 is a plan view of the ceramic heater 100 according to Modification Example 2. FIG. 9 is a schematic diagram showing the cross-section of the ceramic heater 100 shown in FIG. 8 taken along the line C-C. Hereinafter, description will be mainly given of the difference between the above-described embodiment and Modification Example 2.

As shown in FIGS. 8 and 9, the first region 22 of the first base 12 has a horizontal surface. The first base 12 does not have the first exhaust hole 26.

The embedded electrode 18 is applied with a DC high voltage from a DC high-voltage power source (unillustrated) to thereby generate an electrostatic adsorption force on the horizontal surface of the first region. Thus, the mounted substrate is held on the mounting surface 12b by the electrostatic chuck.

With this structure, a substrate can be held on the mounting surface 12b regardless of the pressure around the ceramic heater 100. Moreover, the other structure is the same as that of the embodiment described above. Thus, this Modification Example 2 also prevents the upper surface of the first base 12 from corrosion.

Modification Example 3

Hereinafter, a ceramic heater 100 according to Modification Example 3 of the embodiment of the present invention will be described.

In Modification Example 2 described above, the description has been given of the case where the first region 22 of the first base 12 has the horizontal surface. However, the present invention is not limited to this. For example, the first region 22 may have the structure shown in FIGS. 6 and 7 also in the case where a substrate is held by the electrostatic chuck. In this case, a high-thermal-conductivity gas supply source may be connected to a space formed by the annular protrusion 22a, each protrusion 22c and the substrate through the first exhaust hole 26, the second exhaust hole 34 and the third exhaust hole 40. Then, a high-thermal-conductivity gas may be supplied to the space.

EXAMPLES

Figure 10:
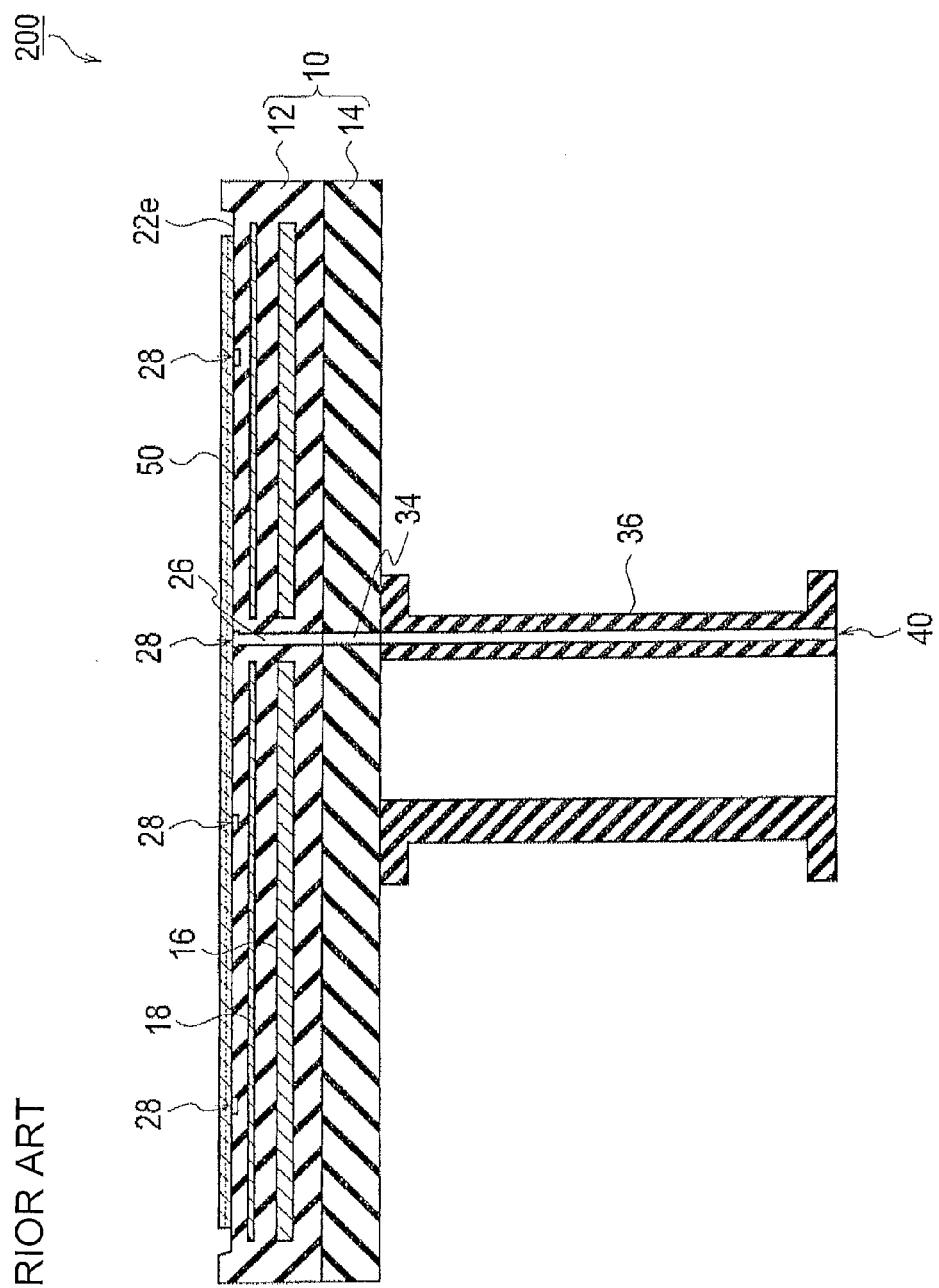
FIG. 10 is a cross-sectional view showing one example of a ceramic heater 200 according to Comparative Example.

Hereinafter, properties of the ceramic heater are evaluated. As the ceramic heaters to be evaluated, the ceramic heaters 100 (Test Examples 1 to 26) shown in FIG. 1 and the ceramic heater 200 (Comparative Example) shown in FIG. 10 were produced. As for the ceramic heaters (Test Examples 1 to 26) shown in FIG. 1, parameters (the width Wt and the depth Tt of the purge groove 20, the surface-to-surface distance Tg, the diameter D of the purge hole 24, the PCD of the purge holes 24, and the number of the purge holes 24 shown in FIG. 5) were changed (see tables in FIG. 11 and FIG. 12). Furthermore, the ceramic heater 200 produced as Comparative Example has a flat substrate-mounting surface 22e that is not subjected to gas purging, as shown in FIG. 10. FIG. 10 shows a state where the substrate 50 is mounted on the ceramic heater 200 according to Comparative Example.

Evaluation Criteria

The ceramic heater to be evaluated was placed in a reaction chamber of a plasma CVD apparatus. A substrate was mounted on the substrate-mounting surface of the plate 10 and held by a vacuum chuck. Regarding the ceramic heaters 100 (Test Examples 1 to 26), while flowing a purge gas, a temperature in the CVD apparatus was increased to 600° C. Then, the temperature uniformity and the film-formation property were evaluated. Meanwhile, regarding the ceramic heater 200 (Comparative Example), the temperature in the CVD apparatus was increased to 600° C. without flowing the purge gas. Then, the temperature uniformity and the film-formation property were evaluated. The table in FIG. 11 shows the properties evaluation results of each ceramic heater thus produced.

The "temperature uniformity" of the ceramic heater was measured with a radiation pyrometer of an infrared camera. Herein, the "temperature uniformity" is defined by the difference between the highest temperature and the lowest temperature in the temperature distribution of a substrate, such as AlN, mounted on the substrate-mounting surface of the plate 10 (for details, see a table in FIG. 13). Incidentally, the "temperature uniformity" in the table of FIG. 11 is based on the initial temperature distribution.

The "film-formation property" was evaluated by forming a W metal film on the surface of the substrate 50 such as silicon (Si) by plasma CVD using tungsten hexafluoride ($WF_6$), for example. The thickness of the formed metal film was measured with a film-thickness measuring device. The number of particles such as $AlF_3$ attached to the back surface of the substrate 50 during the film formation was measured with a surface foreign-matter inspecting device. Herein, the film thickness distribution is defined as $\{(Tmax-Tmin)/Tave\} \times 100(\%)$ where Tmax denotes the maximum film thickness, Tmin denotes the minimum film thickness, and Tave denotes the average film thickness (for details, see the table in FIG. 13).

A "corrosion amount" is the maximum depth dented due to corrosion in the vicinity of the convex portion 12a. The corrosion amount was measured with a surface roughness gauge after the ceramic heater with a substrate mounted thereon was exposed to plasma for an equivalent period for processing 5000 substrates (for details, see the table in FIG. 13).

The table in FIG. 12 shows values and ranges of the parameters of the purge groove 20 and the purge hole 24 shown in the table of FIG. 11, the values and the ranges corresponding to reference symbols A, B, C, D, E and F. For example, in the case of Comparative Example shown in FIG. 10, all the parameters are 0, and are thus represented by "A" in the table of FIG. 11.

The table in FIG. 13 shows ranges corresponding to reference symbols ⊚, ○ and x which are evaluation criteria for the ceramic heater. ⊚ denotes that the ceramic heater is within a range of the optimum specification values (hereinafter, stated as "preferable") ○ denotes that the ceramic heater is within a range of usable specification values (hereinafter, stated as "acceptable"). x denotes that the ceramic heater is out of the range of the usable specification values (hereinafter, stated as "unacceptable").

Herein, the "entire" temperature uniformity indicates the evaluation on the temperature uniformity of the entire surface of a substrate held on the mounting surface of the ceramic heater. Specifically, the "entire" temperature uniformity indicates the evaluation on the average temperature difference between the maximum temperature and the minimum temperature in the entire surface of the substrate. The average temperature difference lower than 3° C. is preferable; 3° C. or higher but lower than 5° C. is acceptable; and 5° C. or higher is unacceptable. The "outer periphery" temperature uniformity indicates the evaluation on the temperature uniformity of the substrate with the radius in a range from 138 mm to 144 mm. Specifically, the "outer periphery" temperature uniformity indicates the evaluation on the average temperature difference between the maximum temperature and the minimum temperature of the substrate with the radius in the range from 138 mm to 144 mm. The average temperature difference lower than 2° C. is preferable; 2° C. or higher but lower than 3° C. is acceptable; and 3° C. or higher is unacceptable.

The "temporal change" in the film-formation property indicates the evaluation on the temporal change of the film thickness distribution in a formed metal film. If the change relative to the film thickness distribution at the beginning of the ceramic heater usage is less than 1%, the "temporal change" in the film-formation property is preferable; 1% or more but less than 2% is acceptable; and 2% or more is unacceptable. The "particle" in the film-formation property indicates the evaluation on the number of particles attached to the back surface of the substrate 50 during the film formation. The particle number less than 10000 is preferable; 10000 or more but less than 20000 is acceptable; and 20000 or more is unacceptable.

The "corrosion amount" indicates the evaluation on the maximum depth dented due to corrosion. The maximum dented depth less than 5 μm is preferable; 5 μm or deeper but less than 10 μm is acceptable; 10 μm or deeper is unacceptable.

Comparative Example

As shown in FIG. 11, in Comparative Example, the "entire" temperature uniformity was preferable, and the "outer periphery" temperature uniformity was acceptable, which satisfies the specification. However, both the film-formation property and the corrosion amount were unacceptable. In Comparative Example, a purge gas cannot flow as shown in FIG. 10. For this reason, the mounting surface 22e is corroded by a corrosive gas stagnating between the outer edge of the substrate 50 and the convex portion 12a of the first base 12, and accordingly a dent 60 is formed as shown in FIG. 14. The dent 60 is increased in size as the film formation is repeated, thereby increasing the "temporal change" in the film-formation property. As a result, the reliability of the processed substrate is reduced. Additionally, since the corrosive gas cannot be purged, the number of particles attached to the back surface of the substrate 50 is also increased.

Test Examples 1 to 5

Meanwhile, in Test Example 1 where the width and the depth of the purge groove 20, the surface-to-surface distance, the diameter of the purge hole 24, the PCD of the purge holes 24 and the number of the purge holes 24 were set to D, the temperature uniformity, the film-formation property, and the corrosion amount were all preferable. In Test Example 2 to Test Example 5, only the width of the purge groove 20 was changed from that in Test Example 1. The widths in Test Example 2 to Test Example 5 were respectively set to B, C, E and F. In Test Example 2 where the width was less than 0.5 mm, the "particle" was acceptable, but all the other evaluation items were unacceptable. In Test Example 3 where the width was 0.5 mm, the "temporal change" was preferable, and the other evaluation items were acceptable. In Test Example 4 where the width was 4 mm, the film-formation property and the corrosion amount were preferable, and the temperature uniformity was acceptable. In Test Example 5 where the width exceeded 4 mm, the "entire" temperature uniformity and the corrosion amount were acceptable, but the other evaluation items were unacceptable.

From these results, it was found out that the width Wt of the purge groove 20 is desirably in a range between 0.5 mm and 4 mm, and is more desirably approximately 2 mm. The reasons are as follows. Specifically, if the width Wt is less than 0.5 mm, the pressure of a supplied purge gas is increased, which causes the substrate 50 to float. Meanwhile, if the width Wt exceeds 4 mm, the substrate 50 above the purge groove 20 is heated insufficiently, which deteriorates the temperature uniformity.

Test Examples 6 to 9

In Test Example 6 to Test Example 9, only the depth of the purge groove 20 was changed from that in Test Example 1. The depths in Test Example 6 to Test Example 9 were respectively set to B, C, E and F. In Test Example 6 where the depth was less than 0.025 mm, the "temporal change" was preferable, the "particle" and the corrosion amount were acceptable, and the temperature uniformity was unacceptable. In both Test Example 7 and Test Example 8 where the depths were respectively 0.025 mm and 0.25 mm, the film-formation property and the corrosion amount were preferable, and the temperature uniformity was acceptable. In Test Example 9 where the depth exceeded 0.25 mm, the "temporal change" was preferable, the "entire" temperature uniformity and the "particle" were acceptable, and the "outer periphery" temperature uniformity and the corrosion amount were unacceptable.

From these results, it was found out that the depth Tt of the purge groove 20 is desirably in a range between 0.025 mm and 0.25 mm, and is more desirably approximately 0.08 mm. The reasons are as follows. Specifically, if the depth is less than 0.025 mm, the pressure of a supplied purge gas is increased, which causes the substrate 50 to float and accordingly deteriorates the temperature uniformity. Meanwhile, if the depth exceeds 0.25 mm, the substrate 50 above the purge groove 20 is heated insufficiently, which deteriorates the temperature uniformity.

Test Examples 10 to 14

In Test Example 10 to Test Example 14, only the surface-to-surface distance of the purge groove 20 was changed from that in Test Example 1. The surface-to-surface distances in Test Example 10 to Test Example 14 were respectively set to A, B, C, E and F. In Test Example 10 where the surface-to-surface distance was 0, all the evaluation items were unacceptable. In Test Example 11 where the surface-to-surface distance was less than 0.01 mm, the "entire" temperature uniformity and the "particle" were acceptable, and the "outer periphery" temperature uniformity, the "temporal change" and the corrosion amount were unacceptable. In both Test Example 12 and Test Example 13 where the surface-to-surface distances were respectively 0.01 mm and 0.1 mm, the "outer periphery" temperature uniformity was acceptable, and the other evaluation items were preferable. In Test Example 14 where the surface-to-surface distance exceeded 0.1 mm, the "temporal change" was preferable, the "particle" was acceptable, and the temperature uniformity and the corrosion amount were unacceptable.

From these results, it was found out that the surface-to-surface distance Tg between the first region 22 and the second region 23 is desirably in a range between 0.01 mm and 0.1 mm, and is more desirably approximately 0.05 mm. The reasons are as follows.

If the surface-to-surface distance is less than 0.01 mm, the surface of the first region 22 is located substantially on the same level as the surface of the second region 23 as in Comparative Example. Accordingly, the substrate 50 partially comes into contact with the surface of the second region 23. For this reason, a purge gas cannot uniformly flow toward the outer edge portion of the first base 12 from the back surface, in the vicinity of the outer edge, of the substrate 50. In other words, the flow of the purge gas is partially blocked by the contact portion between the substrate 50 and the surface of the second region 23. Thus, a corrosive gas stays in the vicinity of the side wall of the convex portion 12a provided at the outer edge portion of the first base 12. As a result, a surface of the second region 23 in a region formed between the outer edge of the substrate 50 and the convex portion 12a of the first base 12 is corroded by the corrosive gas. In this way, the dent 60 as shown in FIG. 14 is partially formed.

Meanwhile, if the surface-to-surface distance Tg exceeds 0.1 mm, the purge gas is ejected in a non-uniform manner from the gap between the surface of the second region 23 and the back surface, in the vicinity of the outer edge, of the substrate 50. Specifically, the amount of the purge gas ejected from the vicinity of the purge holes 24 is increased. Furthermore, the surface-to-surface distance Tg exceeding 0.1 mm adversely affects the temperature uniformity of the substrate 50.

Test Examples 15 to 18

In Test Example 15 to Test Example 18, only the diameter of the purge hole 24 was changed from that in Test Example 1. The diameters in Test Example 15 to Test Example 18 were respectively set to B, C, E and F. In Test Example 15 where the diameter was less than 0.25 mm, the temperature uniformity was preferable, the corrosion amount was acceptable, and the film-formation property was unacceptable. In Test Example 16 where the diameter was 0.25 mm, all the evaluation items were preferable. In Test Example 17 where the diameter was 2 mm, the "outer periphery" temperature uniformity was acceptable, and the other evaluation items were preferable. In Test Example 18 where the diameter exceeded 2 mm, the "temporal change" was preferable, the "entire" temperature uniformity and the "particle" were acceptable, and the "outer periphery" temperature uniformity and the corrosion amount were unacceptable.

From these results, it was found out that the diameter D of the purge hole 24 is desirably in a range between 0.25 mm and 2 mm, and is more desirably approximately between 0.25 mm and 1 mm. The reasons are as follows. Specifically, if the diameter is less than 0.25 mm, a purge gas cannot flow at a sufficient flow rate, and the corrosive gas cannot be purged sufficiently. Meanwhile, if the diameter exceeds 2 mm, the outer periphery of the substrate 50 is cooled by a purge gas, which deteriorates the temperature uniformity of the outer periphery.

Test Examples 19 to 22

In Test Example 19 to Test Example 22, only the PCD of the purge holes 24 was changed from that in Test Example 1. The PCDs in Test Example 19 to Test Example 22 were respectively set to B, C, E and F. In Test Example 19 where the PCD was less than 280 mm, the "temporal change" was preferable, the "entire" temperature uniformity and the "particle" were acceptable, and the "outer periphery" temperature uniformity and the corrosion amount were unacceptable. In Test Example 20 where the PCD was 280 mm, the temperature uniformity was acceptable, and the film-formation property and the corrosion amount were preferable. In Test Example 21 where the PCD was 299 mm, all the evaluation items were preferable. In Test Example 22 where the PCD exceeded 299 mm, the temperature uniformity was preferable, the corrosion amount was acceptable, and the film-formation property was unacceptable.

From these result, it was found out that the PCD of the purge holes 24 is desirably in a range between 280 mm and 299 mm, and is more desirably approximately between 290 mm and 299 mm. The reasons are as follows.

If the PCD is less than 280 mm, a purge gas is supplied to the vicinity of the central region of the substrate 50, which deteriorates the temperature uniformity.

Meanwhile, if the PCD exceeds 299 mm, the gap portion between the back surface of the substrate 50 and the surface of the second region 23 is narrowed. This makes it difficult for a purge gas to flow toward the convex portion 12a provided at the outer edge portion of the upper surface of the first base 12. This, in turn, makes it easy for a corrosive gas to flow from the outer edge of the substrate toward the center thereof. As a result, the corrosive gas goes around the back surface of the substrate 50, and corrodes the surface of the heater and consequently deteriorates the film-formation property.

Test Examples 23 to 26

In Test Example 23 to Test Example 26, only the number of the purge holes 24 was changed from that in Test Example 1. The numbers in Test Example 23 to Test Example 26 were respectively set to B, C, E and F. In Test Example 23 where the number was less than 8, the "entire" temperature uniformity and the "particle" were acceptable, and the "outer periphery" temperature uniformity, the "temporal change" and the corrosion amount were unacceptable. In both Test Example 24 and Test Example 25 where the numbers were respectively 8 and 48, the temperature uniformity was acceptable, and the film-formation property and the corrosion amount were preferable. In Test Example 26 where the number exceeded 48, the "temporal change" was preferable, the "particle" was acceptable, and the temperature uniformity and the corrosion amount were unacceptable.

From these results, it was found out that the number of the purge holes 24 is desirably in a range between 8 and 48, and is more desirably approximately 36. The reasons are as follows. Specifically, if the number of the purge holes 24 is less than 8, a purge gas cannot be supplied uniformly to the entire outer periphery of the substrate 50, which deteriorates the temperature uniformity of the outer periphery of the substrate 50. Moreover, the corrosive gas is purged non-uniformly, and the plate 10 is corroded. To the end, the temporal change in the film-formation property occurs, which increases the corrosion amount. Meanwhile, if the number of the purge holes 24 exceeds 48, a purge gas significantly cools the substrate 50 above the purge groove 20, which adversely affects the temperature uniformity.

Summary of the Results

As has been described above, according to the embodiment of the present invention, a corrosive gas stagnating in the vicinity of the outer edge of the substrate 50 in CVD or the like can be removed. As a result, the substrate-mounting surface of the ceramic heater is effectively prevented from corrosion.

What is claimed is:

1. A ceramic heater for a semiconductor substrate process comprising:
    a mounting plate on which the substrate is mounted; and
    a supporter configured to support the mounting plate, wherein
    the mounting plate includes:
        a first base made of a ceramic sintered body and having a mounting surface on which the substrate is mounted, and having a lower surface provided on an opposite side to the mounting surface; and
        a second base made of a ceramic sintered body and having an upper surface bonded to the lower surface of the first base, and having a lower surface provided on an opposite side to the upper surface,
    the supporter is made of a ceramic sintered body, is bonded to the lower surface of the second base, and includes a first penetration hole penetrating from one end of the supporter to the other end of the supporter,
    a first region, a first groove and a second region are defined on the mounting surface of the first base,
    the first region has a first surface contacting with the mounted substrate;
    the first groove is provided in a portion covered with the substrate and surrounds the first region; and
    the second region has a second surface directly adjacent to and surrounding the first groove,
    the first base has:
        an adsorber configured to adsorb the mounted substrate onto the first surface; and
        a plurality of holes each penetrating from a bottom surface of the first groove to the lower surface of the first base,
    at least one of the upper surface of the second base and the lower surface of the first base is provided with a second groove connected to each of the plurality of holes,
    the second base has a second penetration hole connected to the second groove and to the first penetration hole,
    the first groove is supplied with an inert gas through the first penetration hole, the second penetration hole, the second groove, and the plurality of holes,
    the entirety of the second surface of the second region is located lower than the first surface of the first region and higher than a bottom surface of the first groove, and
    wherein a portion of the second surface of the second region is covered with the mounted substrate,
    wherein an annular convex portion surrounds the second surface of the second region, and wherein an inside wall of the convex portion has a tapered surface that surrounds a space formed between the mounted substrate and the second surface of the second region so as to openly enlarge outward from the bottom upward.

2. The ceramic heater according to claim 1, wherein as the adsorber, the first base has a third groove provided in the first surface, and
    the third groove is evacuated to hold the substrate on the first region.

3. The ceramic heater according to claim 2, further comprising:
    a heating element provided in the first base; and
    an embedded electrode provided between the mounting surface of the first base and the heating element.

4. The ceramic heater according to claim 1, wherein as the adsorber, the first base has an annular protrusion, a bottom surface surrounded by the annular protrusion and a plurality of embosses provided on the bottom surface in the first region, the annular protrusion and the plurality of embosses supporting the substrate, and
    a space formed by the substrate, the annular protrusion and the bottom surface is evacuated to hold the substrate on the first region.

5. The ceramic heater according to claim 4, further comprising:
    a heating element provided in the first base; and
    an embedded electrode provided between the mounting surface of the first base and the heating element.

6. The ceramic heater according to claim 1, wherein as the adsorber, an electrode is embedded in the first base, and
    the electrode generates an electrostatic adsorption force at least on the first surface of the first region to hold the substrate on the first region.

7. The ceramic heater according to claim 6, further comprising
    a heating element provided in the first base, wherein
    the electrode is provided between the mounting surface of the first base and the heating element.

8. The ceramic heater according to claim 1, wherein when the substrate has a diameter of 300 mm,
    the first groove has a width ranging between 0.5 mm and 4 mm,
    the first groove has a depth ranging between 0.025 mm and 0.25 mm,
    a distance between the first surface of the first region and the second surface of the second region ranges between 0.01 mm and 1 mm,
    each of the plurality of holes has a diameter ranging between 0.25 mm and 2 mm,
    a diameter of a circle connecting the respective centers of the plurality of holes to each other ranges between 280 mm and 299 mm, and
    the number of the holes is 8 to 48.

9. The ceramic heater according to claim 8, further comprising:
    a heating element provided in the first base; and
    an embedded electrode provided between the mounting surface of the first base and the heating element.

10. The ceramic heater according to claim 1, further comprising:
    a heating element provided in the first base; and
    an embedded electrode provided between the mounting surface of the first base and the heating element.

* * * * *